(12) United States Patent
Camacho et al.

(10) Patent No.: US 8,729,693 B2
(45) Date of Patent: May 20, 2014

(54) INTEGRATED CIRCUIT PACKAGING SYSTEM WITH A LEADED PACKAGE AND METHOD OF MANUFACTURE THEREOF

(75) Inventors: Zigmund Ramirez Camacho, Singapore (SG); Arnel Senosa Trasporto, Singapore (SG); Lionel Chien Hui Tay, Singapore (SG); Henry Descalzo Bathan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 517 days.

(21) Appl. No.: 12/565,144

(22) Filed: Sep. 23, 2009

(65) Prior Publication Data
US 2011/0068458 A1    Mar. 24, 2011

(51) Int. Cl.
*H01L 23/28* (2006.01)
*H01L 21/56* (2006.01)

(52) U.S. Cl.
USPC ............ 257/693; 257/E21.502; 257/E23.116; 257/686; 257/777; 257/738; 438/109; 438/123; 438/124

(58) Field of Classification Search
USPC .......... 257/693, E21.502, E23.116, 686, 777, 257/738; 438/124, 123, 109
See application file for complete search history.

(56) References Cited

U.S. PATENT DOCUMENTS

| | | |
|---|---|---|
| 6,184,573 B1 | 2/2001 | Pu |
| 6,759,737 B2 | 7/2004 | Seo et al. |
| 6,818,973 B1 | 11/2004 | Foster |
| 7,029,947 B2 | 4/2006 | Joshi |
| 7,211,471 B1 | 5/2007 | Foster |
| 7,384,819 B2 | 6/2008 | Yip et al. |
| 2006/0231937 A1* | 10/2006 | Juskey et al. ................. 257/686 |
| 2007/0007633 A1* | 1/2007 | Minamio et al. .............. 257/666 |
| 2009/0127668 A1* | 5/2009 | Choi ............................. 257/621 |
| 2010/0025834 A1* | 2/2010 | Camacho et al. ............. 257/686 |

* cited by examiner

*Primary Examiner* — Cathy N Lam
(74) *Attorney, Agent, or Firm* — Ishimaru & Associates LLP

(57) ABSTRACT

A method of manufacture of an integrated circuit packaging system includes: providing a first device having a first exposed side and a first inward side; connecting a second device having a second exposed side and a second inward side facing the first inward side to the first device, the second device having planar dimensions less than planar dimensions of the first device; connecting a system connector to a perimeter of the first inward side, the system connector having an exposed leg partially vertical and an exposed foot partially horizontal; and applying an encapsulant exposing the first exposed side, the second exposed side, the exposed leg, and the exposed foot, the exposed leg offset from the encapsulant, the exposed foot on an end of the system connector opposite the first device.

20 Claims, 3 Drawing Sheets

INTEGRATED CIRCUIT PACKAGING SYSTEM WITH A LEADED PACKAGE AND METHOD OF MANUFACTURE THEREOF

TECHNICAL FIELD

The present invention relates generally to an integrated circuit packaging system, and more particularly to a system for a stacked component package.

BACKGROUND ART

Products must compete in world markets and attract many consumers or buyers in order to be successful. It is very important for products to continue to improve in features, performance, and reliability while reducing product costs, product size, and equally important to be available quickly for purchase by the consumers or buyers.

A tremendous market growth for high density and high output/input integrated circuit packages has resulted in a trend for electronic products that are lightweight, smaller in size, multi-functional, and with ever increasing higher speeds. Electronic products such as cell phone base products, global positioning systems (GPS), satellites, communication equipment, consumer products, and a vast line of other similar products are in ever increasing global demand.

Therefore, there is an important need that exists for components in the package to become thinner and thinner to reduce the size of the whole package effectively without sacrificing performance and speed.

Each of the integrated circuit packages within the cell phone can contain large amounts of complex circuitry. The circuitry within each of the integrated circuit packages work and communicate with other circuitry of other integrated circuit packages and electrical parts using electrical connections on circuit boards requiring many connections between packages.

Time to market, reliability, the number of integrated circuit packages, and the number of electrical parts on the circuit boards inside a product are important to improving the features, performance, and reliability of any product. Furthermore, the ways the circuitry and electrical connections are implemented have a direct impact on the availability, reliability, yield, and costs of products.

Attempts have failed to provide a complete solution addressing simplified manufacturing processing, time to market, improved reliability, reduced electrical parts on the circuit boards, and size reductions of the circuit boards with increased functionality, leveragability, and increased product features to the consumer.

Thus, an increasing need remains for an efficient and cost effective solution for parts mounted on the circuit boards continue in the electronic industry. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a first device having a first exposed side and a first inward side; connecting a second device having a second exposed side and a second inward side facing the first inward side to the first device, the second device having planar dimensions less than planar dimensions of the first device; connecting a system connector to a perimeter of the first inward side, the system connector having an exposed leg partially vertical and an exposed foot partially horizontal; and applying an encapsulant exposing the first exposed side, the second exposed side, the exposed leg, and the exposed foot, the exposed leg offset from the encapsulant, the exposed foot on an end of the system connector opposite the first device.

The present invention provides an integrated circuit packaging system including: a first device having a first exposed side and a first inward side; a second device having a second exposed side and a second inward side facing the first inward side connected to the first device, the second device having planar dimensions less than planar dimensions of the first device; a system connector connected to a perimeter of the first inward side, the system connector having an exposed leg partially vertical and an exposed foot partially horizontal; and an encapsulant exposing the first exposed side, the second exposed side, the exposed leg, and the exposed foot, the exposed leg offset from the encapsulant, the exposed foot on an end of the system connector opposite the first device.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
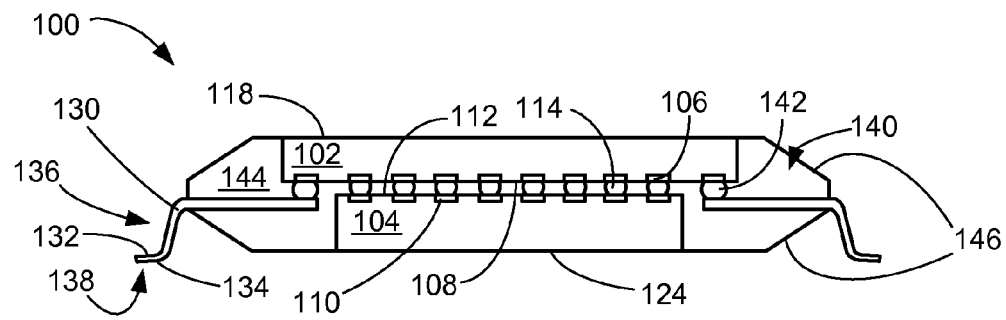
FIG. 1 is a cross-sectional view of an integrated circuit packaging system in a first embodiment of the present invention taken along a line 1-1 of FIG. 2.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGURES. Similarly, although the views in the drawings shown for ease of description and generally show similar orientations, this depiction in the FIGURES is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
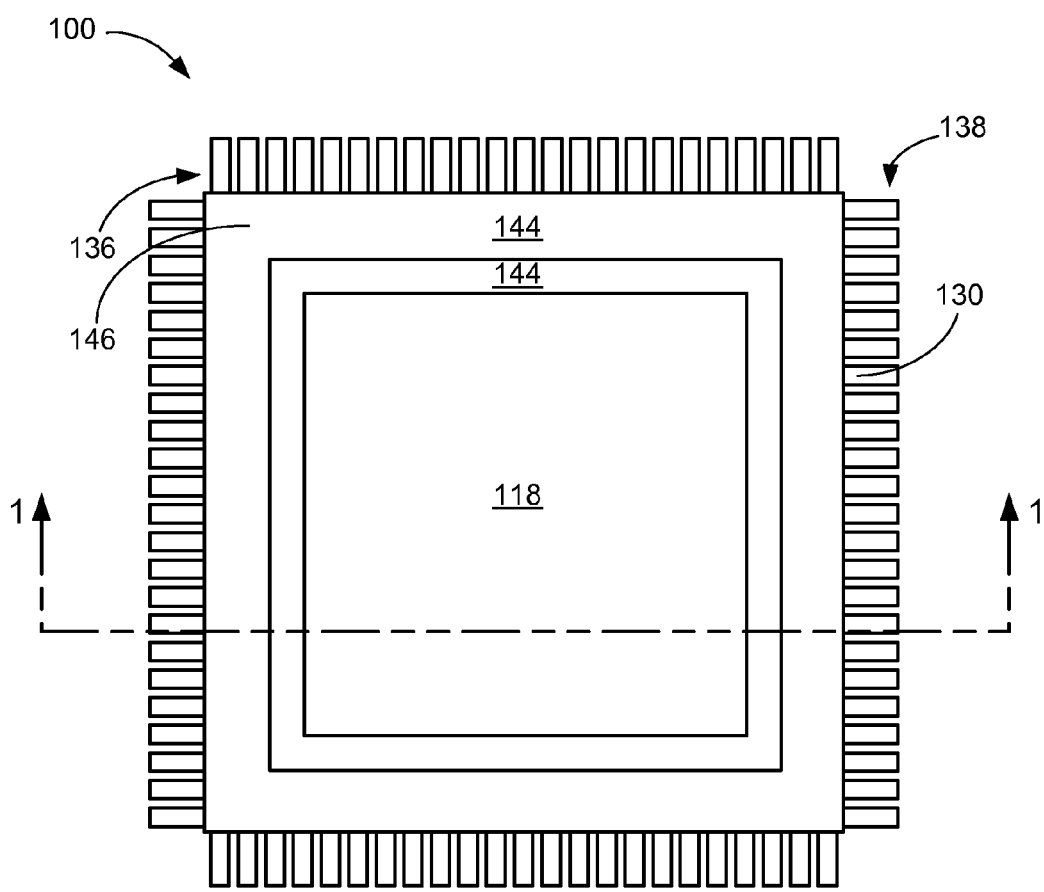
FIG. 2 is a top view of the structure of FIG. 1.

Referring now to FIG. 1, therein is shown a cross-sectional view of an integrated circuit packaging system 100 in a first embodiment of the present invention taken along a line 1-1 of FIG. 2. The integrated circuit packaging system 100 can preferably include a first device 102, such as a flip chip, a wafer level chip scale package (WLCSP), or an integrated circuit device, connected over a second device 104.

The first device 102 can preferably have planar dimensions greater than planar dimensions of the second device 104, such as a stacked flip chip, a WLCSP, or an integrated circuit device. A thickness of the first device 102 can be different from a thickness of the second device 104. A planar center of the first device 102 can be vertically aligned with a planar center of the second device 104.

First device connectors 106, such as pads or contacts on a first inward side 108 of the first device 102, can connect to second device connectors 110 on a second inward side 112 of the second device 104. The first device connectors 106, used to provide connectivity with circuitry of the first device 102, can be distributed across the first inward side 108.

Device interconnects 114, such as conductive balls or bumps, can be attached between the first device connectors 106 and the second device connectors 110, substantially similar to the first device connectors 106. The second device connectors 110, used to provide connectivity with circuitry of the second device 104, can be distributed across the second inward side 112.

A first exposed side 118 of the first device 102 opposite the first inward side 108 and a second exposed side 124 of the second device 104 opposite the second inward side 112 can preferably be parallel to one another.

System connectors 130, such as J-leads, package leads, or electrical conductors, can surround the second device 104. The system connectors 130 can include an upper surface 132 and a lower surface 134 opposite the upper surface 132.

The system connectors 130 can preferably be formed having an exposed leg 136, an exposed foot 138, and an internal section 140. The exposed leg 136 can have a partially vertical cross-sectional profile with curved ends and an overall height equal to a thickness of the first device 102 or a thickness of the second device 104.

The exposed foot 138 can have a partially horizontal cross-sectional profile and extend from an end of the exposed leg 136. The internal section 140 can have a horizontal cross-sectional profile and extend from an end of the exposed leg 136 opposite the end of the exposed leg 136 having the exposed foot 138.

The internal section 140 and the exposed leg 136 can preferably extend in opposite directions away from the exposed leg 136 and coplanar to planes formed a cross-sectional length of the exposed leg 136.

The internal section 140 of the system connectors 130 can surround the second device 104 and substantially protrude over the first inward side 108 of the first device 102. The exposed foot 138 can be used to attach the integrated circuit packaging system 100 to a subsystem such as a printed circuit board or another packaging system.

Perimeter interconnects 142, similar to the device interconnects 114, can be used to directly connect each of the first device connectors 106 that are located around a perimeter of the first inward side 108 with the upper surface 132 of the internal section 140 of the system connectors 130. The system connectors 130 can preferably be formed having the exposed leg 136 extend towards a plane having the second exposed side 124. The exposed foot 138 of all of the system connectors 130 can be coplanar and extend through the plane having the second exposed side 124.

The integrated circuit packaging system 100 can be encapsulated with an encapsulant 144 surrounding the internal section 140 of each of the system connectors 130, the first device 102, and the second device 104. The first exposed side 118 of the first device 102 or the second exposed side 124 of the second device 104 can preferably be substantially exposed of the encapsulant 144.

It has been discovered that having the first exposed side 118 and the second exposed side 124 substantially exposed of the encapsulant 144 can significantly improve the thermal performance of the integrated circuit packaging system 100.

The encapsulant 144 can be formed having tapered sides 146 that extend perpendicularly from a perimeter edge of the first exposed side 118 or a perimeter edge of the second exposed side 124 to the system connectors 130 closest the perimeter edge of the first exposed side 118 or the perimeter edge of the second exposed side 124. The edges of the tapered sides 146 closest to the system connectors 130 can converge towards the system connectors 130.

It has been further discovered that the tapered sides 146 of the encapsulant 144 can reduce the quantity of the encapsulant 144 required for manufacture of the present invention, thus reducing the production cost per unit of the integrated circuit packaging system 100. For example, the use of the tapered sides 146 requires less encapsulant material than an encapsulated package having right-angled sides and equivalent overall dimensions as the integrated circuit packaging system 100.

Furthermore, it has been discovered that the present invention provides an efficient solution for three-dimensional (3D) integration of WLCSP packages in a cost efficient base package or leaded base package.

It has been found that the present invention can use available space of or within a quad flat package (QFP) to create or configured a WLCSP device integrated package. It has also been found that exposed terminal pads can be created on the blank molded surface to provide extra terminal leads for further external device stacking.

Referring now to FIG. 2, therein is shown a top view of the structure of FIG. 1. For illustrative purposes, the integrated circuit packaging system 100 is shown having a rectangular shape. The integrated circuit packaging system 100 can have any shape. The exposed foot 138 and the exposed leg 136 of each of the system connectors 130 are shown perpendicular to and extending from sides of the integrated circuit packaging system 100.

The encapsulant 144 is shown surrounding the first exposed side 118 with the tapered sides 146 of the encapsulant 144 along the sides of the integrated circuit packaging system 100 closest to the exposed leg 136 of each of the system connectors 130.

Figure 3:
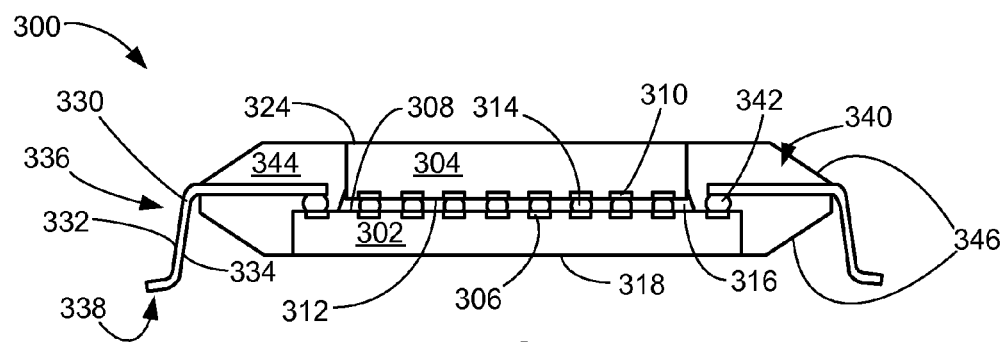
FIG. 3 is a cross-sectional view of an integrated circuit packaging system in a second embodiment of the present invention.

Referring now to FIG. 3, therein is shown a cross-sectional view of an integrated circuit packaging system 300 in a second embodiment of the present invention. The integrated circuit packaging system 300 can preferably include a first device 302, such as a flip chip, a WLCSP, or an integrated circuit device, connected over a second device 304.

The first device 302 can preferably have planar dimensions greater than planar dimensions of the second device 304, such as a stacked flip chip, a WLCSP, or an integrated circuit device. A thickness of the first device 302 can be different from a thickness of the second device 304. A planar center of the first device 302 can be vertically aligned with a planar center of the second device 304.

First device connectors 306, such as pads or contacts on a first inward side 308 of the first device 302, can connect to second device connectors 310 on a second inward side 312 of the second device 304. The first device connectors 306, used to provide connectivity with circuitry of the first device 302, can be distributed across the first inward side 308.

Device interconnects 314, such as conductive balls or bumps, can be attached between the first device connectors 306 and the second device connectors 310, substantially similar to the first device connectors 306. The second device connectors 310, used to provide connectivity with circuitry of the second device 304, can be distributed across the second inward side 312.

An underfill 316, such as an epoxy, gel, or an electrically insulative compound, can be applied between the first inward side 308 and the second inward side 312 and surround the device interconnects 314 connected to the second device connectors 310.

A first exposed side 318 of the first device 302 opposite the first inward side 308 and a second exposed side 324 of the second device 304 opposite the second inward side 312 can preferably be parallel to one another.

System connectors 330, such as J-leads, package leads, or electrical conductors, can surround the second device 304. The system connectors 330 can include an upper surface 332 and a lower surface 334 opposite the upper surface 332.

The system connectors 330 can preferably be formed having an exposed leg 336, an exposed foot 338, and an internal section 340. The exposed leg 336 can have a partially vertical cross-sectional profile with curved ends and an overall height equal to a thickness of the first device 302 or a thickness of the second device 304.

The exposed foot 338 can have a partially horizontal cross-sectional profile and extend from an end of the exposed leg 336. The internal section 340 can have a horizontal cross-sectional profile and extend from an end of the exposed leg 336 opposite the end of the exposed leg 336 having the exposed foot 338.

The internal section 340 and the exposed leg 336 can preferably extend in opposite directions away from the exposed leg 336 and coplanar to planes formed a cross-sectional length of the exposed leg 336.

The internal section 340 of the system connectors 330 can surround the second device 304 and substantially protrude over the first inward side 308 of the first device 302. The exposed foot 338 can be used to attach the integrated circuit packaging system 300 to a subsystem such as a printed circuit board or another packaging system.

Perimeter interconnects 342, similar to the device interconnects 314, can be used to directly connect each of the first device connectors 306 that are located around a perimeter of the first inward side 308 with the lower surface 334 of the internal section 340 of the system connectors 330. The system connectors 330 can preferably be formed having the exposed leg 336 extend towards a plane having the first exposed side 318. The exposed foot 338 of all of the system connectors 330 can preferably be coplanar and extend through the plane having the first exposed side 318.

The integrated circuit packaging system 300 can be encapsulated with an encapsulant 344 surrounding the internal section 340 of each of the system connectors 330, the first device 302, and the second device 304. The first exposed side 318 of the first device 302 or the second exposed side 324 of the second device 304 can preferably be substantially exposed of the encapsulant 344.

The encapsulant 344 can be formed having tapered sides 346 that extend perpendicularly from a perimeter edge of the first exposed side 318 or a perimeter edge of the second exposed side 324 to the system connectors 330 closest the perimeter edge of the first exposed side 318 or the perimeter edge of the second exposed side 324. The edges of the tapered sides 346 closest to the system connectors 330 can converge towards the system connectors 330.

Figure 4:
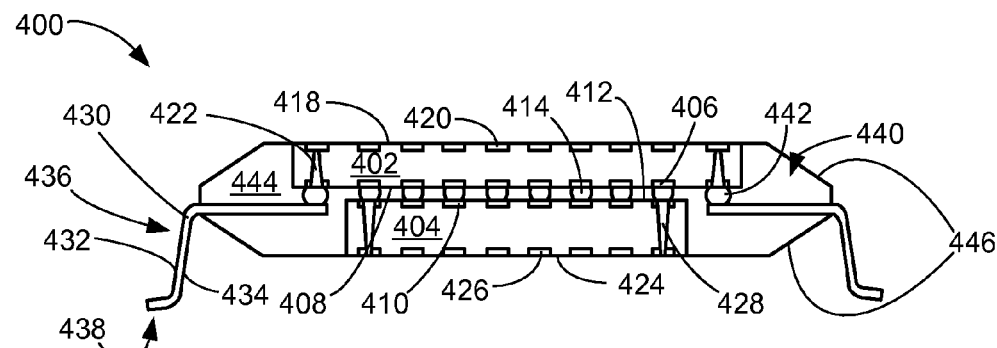
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. The integrated circuit packaging system 400 can preferably include a first device 402, such as a flip chip, a WLCSP, or an integrated circuit device, connected over a second device 404.

The first device 402 can preferably have planar dimensions greater than planar dimensions of the second device 404, such as a stacked flip chip, WLCSP, or an integrated circuit device. A thickness of the first device 402 can be different from a thickness of the second device 404. A planar center of the first device 402 can be vertically aligned with a planar center of the second device 404.

First device connectors 406, such as pads or contacts on a first inward side 408 of the first device 402, can connect to second device connectors 410 on a second inward side 412 of the second device 404. The first device connectors 406, used to provide connectivity with circuitry of the first device 402, can be distributed across the first inward side 408.

Device interconnects 414, such as conductive balls or bumps, can be attached between the first device connectors 406 and the second device connectors 410, substantially similar to the first device connectors 406. The second device connectors 410, used to provide connectivity with circuitry of the second device 404, can be distributed across the second inward side 412.

A first exposed side 418 of the first device 402 opposite the first inward side 408 and a second exposed side 424 of the second device 404 opposite the second inward side 412 can preferably be parallel to one another.

The first exposed side 418 of the first device 402 opposite the first inward side 408 can be formed having first exposed conductors 420, such as redistributed pads, redistributed layers, or conductors. First through conductors 422, such as through silicon vias, pins, or conductive fill materials, can be formed around a perimeter of the first inward side 408 and through the first device 402 to connect the first inward side 408 with or to the first exposed conductors 420 distributed across the first exposed side 418.

The second exposed side 424 of the second device 404 opposite the second inward side 412 can be formed having second exposed conductors 426, such as redistributed pads, redistributed layers, or conductors. Second through conductors 428, such as through silicon vias, pins, or conductive fill materials, can be formed in the second device 404, around a perimeter of the second inward side 412, and through the second device 404 connecting the second inward side 412 with the second exposed conductors 426 distributed across the second exposed side 424.

The device interconnects 414 can be used to directly connect each of the second through conductors 428 that are located around a perimeter of the second inward side 412 with the first device connectors 406 to provide connectivity between the first device connectors 406 and the second exposed conductors 426.

System connectors 430, such as J-leads, package leads, or electrical conductors, can surround the second device 404. The system connectors 430 can include an upper surface 432 and a lower surface 434 opposite the upper surface 432.

The system connectors 430 can preferably be formed having an exposed leg 436, an exposed foot 438, and an internal section 440. The exposed leg 436 can have a partially vertical cross-sectional profile with curved ends and an overall height equal to a thickness of the first device 402 or a thickness of the second device 404.

The exposed foot 438 can have a partially horizontal cross-sectional profile and extend from an end of the exposed leg 436. The internal section 440 can have a horizontal cross-sectional profile and extend from an end of the exposed leg 436 opposite the end of the exposed leg 436 having the exposed foot 438.

The internal section 440 and the exposed leg 436 can preferably extend in opposite directions away from the exposed leg 436 and coplanar to planes formed a cross-sectional length of the exposed leg 436.

The internal section 440 of the system connectors 430 can surround the second device 404 and substantially protrude over the first inward side 408 of the first device 402. The exposed foot 438 can be used to attach the integrated circuit packaging system 400 to a subsystem such as a printed circuit board or another packaging system.

Perimeter interconnects 442, similar to the device interconnects 414, can be used to directly connect each of the first through conductors 422 that are located around a perimeter of the first inward side 408 with the upper surface 432 of the internal section 440 of the system connectors 430. The system connectors 430 can preferably be formed having the exposed leg 436 extend towards a plane having the second exposed side 424. The exposed foot 438 of all of the system connectors 430 can preferably be coplanar and extend below the plane having the second exposed side 424. The first through conductors 422 are outside perimeters of the second inward side 412 and the second exposed side 424.

The integrated circuit packaging system 400 can be encapsulated with an encapsulant 444 surrounding the internal section 440 of each of the system connectors 430, the first device 402, and the second device 404. The first exposed side 418, the first exposed conductors 420, the second exposed side 424, or the second exposed conductors 426 can preferably be substantially exposed of the encapsulant 444.

The encapsulant 444 can be formed having tapered sides 446 that extend perpendicularly from a perimeter edge of the first exposed side 418 or a perimeter edge of the second exposed side 424 to the system connectors 430 closest the perimeter edge of the first exposed side 418 or the perimeter edge of the second exposed conductors 426. The edges of the tapered sides 446 closest to the system connectors 430 can converge towards the system connectors 430.

Figure 5:
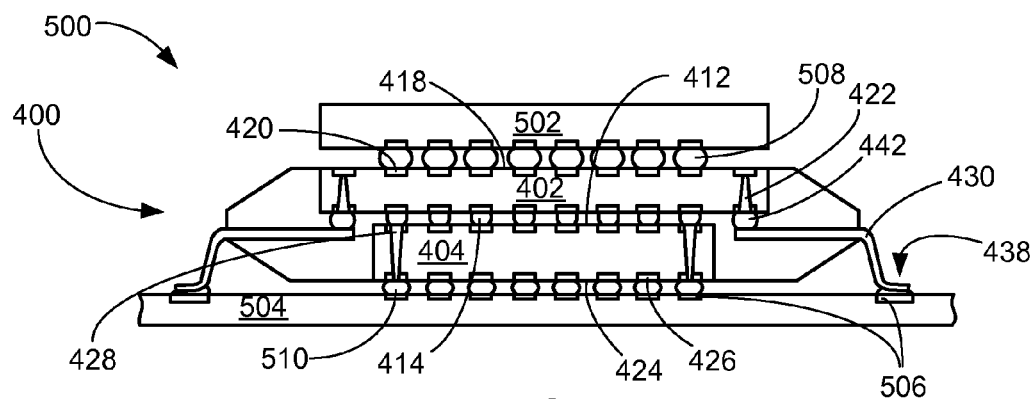
FIG. 5 is a cross-sectional view of an integrated circuit packaging system in a fourth embodiment of the present invention.

Referring now to FIG. 5, therein is shown a cross-sectional view of an integrated circuit packaging system 500 in a fourth embodiment of the present invention. The integrated circuit packaging system 500 can preferably include an external package 502, a circuit board 504, such as a printed wire board (PWB) or printed circuit board (PCB), and the integrated circuit packaging system 400. Board conductors 506 can provide connectivity through the circuit board 504 including exposed portions on any side of the circuit board 504.

An active side of the external package 502, such as an external WLCSP stack, an integrated circuit package, or passive component, can be connected to the first exposed conductors 420 on the first exposed side 418 using stack connectors 508, such as solder balls or solder bumps.

The first through conductors 422 and the perimeter interconnects 442 can provide connectivity between the first exposed conductors 420 and the system connectors 430 of the integrated circuit packaging system 400. The device interconnects 414 can provide connectivity between circuitry of the first device 402 and the second through conductors 428 of the integrated circuit packaging system 400.

The second exposed conductors 426 or the second through conductors 428 on the second exposed side 424 opposite the second inward side 412 of the integrated circuit packaging system 400 can be attached to the circuit board 504 using package connectors 510, such as conductive balls or bumps. The exposed foot 438 of the system connectors 430 can be connected to the board conductors 506 of the circuit board 504.

The package connectors 510 can connect the second exposed conductors 426 or the second through conductors 428 on the second exposed side 424 to the board conductors 506 of the circuit board 504.

Figure 6:
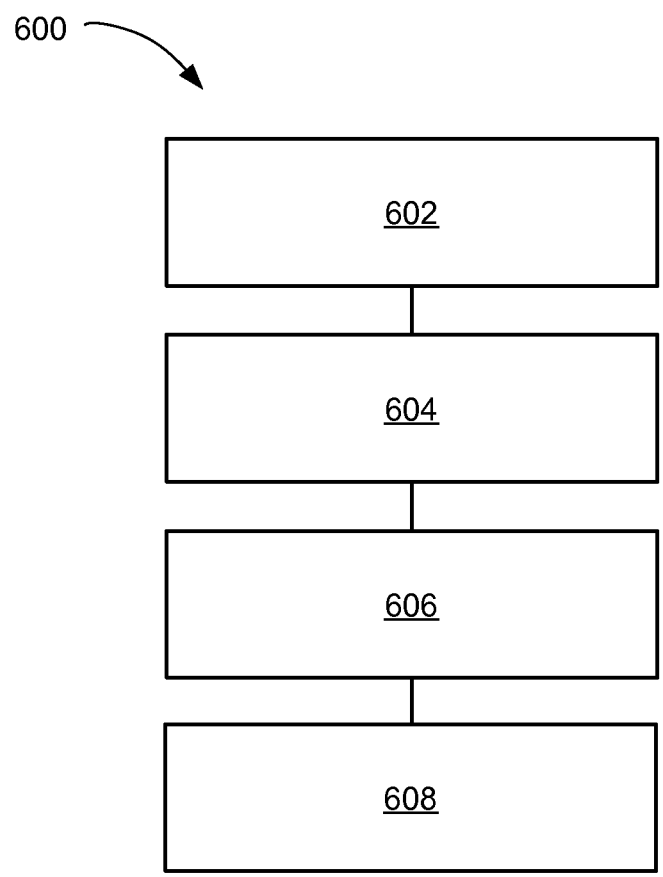
FIG. 6 is a flow chart of a method of manufacture of an integrated circuit packaging system in a further embodiment of the present invention.

Referring now to FIG. 6, therein is shown a flow chart of a method 600 of manufacture of an integrated circuit packaging system in a further embodiment of the present invention. The method 600 includes providing a first device having a first exposed side and a first inward side in a block 602; connecting a second device having a second exposed side and a second inward side facing the first inward side to the first device, the second device having planar dimensions less than planar dimensions of the first device in a block 604; connecting a system connector to a perimeter of the first inward side, the system connector having an exposed leg partially vertical and an exposed foot partially horizontal in a block 606; and applying an encapsulant exposing the first exposed side, the second exposed side, the exposed leg, and the exposed foot, the exposed leg offset from the encapsulant, the exposed foot on an end of the system connector opposite the first device in a block 608.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a first device having a first exposed side, a first inward side, and a first through conductor connecting the first inward side to the first exposed side;
   connecting a second device having a second exposed side and a second inward side facing the first inward side to the first device, the second device having planar dimensions less than planar dimensions of the first device, wherein the first through conductor is outside a perimeter of the second inward side;
   connecting a system connector to a perimeter of the first inward side, the system connector having an exposed leg partially vertical and an exposed foot partially horizontal and extended below a plane having the second exposed side; and
   applying an encapsulant exposing the first exposed side, the second exposed side, the exposed leg, and the exposed foot, the exposed leg offset from the encapsulant and extending between tapered sides, the exposed foot on an end of the system connector opposite the first device.

2. The method as claimed in claim 1 wherein connecting the system connector includes forming the system connector having the exposed leg extend towards a plane having the second exposed side.

3. The method as claimed in claim 1 wherein connecting the system connector includes forming the system connector having the exposed leg extend towards a plane having the first exposed side.

4. The method as claimed in claim 1 further comprising:
   forming a first exposed conductor on the first exposed side; and
   connecting an external package to the first exposed conductor.

5. The method as claimed in claim 1 further comprising:
   connecting a circuit board to the system connector;
   forming a second exposed conductor on the second exposed side; and
   connecting a package connector between the second exposed conductor and the circuit board.

6. A method of manufacture of an integrated circuit packaging system comprising:
   providing a first device having a first exposed side, a first inward side, and a first through conductor connecting the first inward side to the first exposed side;
   connecting a second device with a second exposed side and a second inward side facing the first inward side to the first device, the second device having planar dimensions less than planar dimensions of the first device, wherein the first through conductor is outside a perimeter of the second inward side;
   attaching a device interconnect to the second inward side and the first inward side;
   connecting a system connector to a perimeter of the first inward side, the system connector having an exposed leg partially vertical and an exposed foot partially horizontal and extended below a plane having the second exposed side; and
   applying an encapsulant exposing the first exposed side, the second exposed side, the exposed leg, and the exposed foot, the exposed leg offset from the encapsulant and extending between tapered sides, the exposed foot on an end of the system connector opposite the first device.

7. The method as claimed in claim 6 wherein connecting the system connector includes forming the system connector having the exposed leg and the exposed foot extended away from the first device.

8. The method as claimed in claim 6 wherein connecting the system connector includes forming the system connector having the exposed leg and the exposed foot extended away from the second device.

9. The method as claimed in claim 6 further comprising:
   forming a second exposed conductor on the second exposed side; and
   connecting a through conductor in the second device to the second exposed conductor and the second inward side.

10. The method as claimed in claim 6 further comprising applying an underfill around the device interconnect between the first inward side and the second inward side.

11. An integrated circuit packaging system comprising:
    a first device having a first exposed side, a first inward side, and a first through conductor connecting the first inward side to the first exposed side;
    a second device having a second exposed side and a second inward side facing the first inward side connected to the first device, the second device having planar dimensions less than planar dimensions of the first device, wherein the first through conductor is outside a perimeter of the second inward side;
    a system connector connected to a perimeter of the first inward side, the system connector having an exposed leg partially vertical and an exposed foot partially horizontal and extended below a plane having the second exposed side; and
    an encapsulant exposing the first exposed side, the second exposed side, the exposed leg, and the exposed foot, the exposed leg offset from the encapsulant and between tapered sides, the exposed foot on an end of the system connector opposite the first device.

12. The system as claimed in claim 11 wherein the system connector includes the exposed leg extended towards a plane having the second exposed side.

13. The system as claimed in claim 11 wherein the system connector includes the exposed leg extended towards a plane having the first exposed side.

14. The system as claimed in claim 11 further comprising:
a first exposed conductor on the first exposed side; and
an external package connected to the first exposed conductor.

15. The system as claimed in claim 11 further comprising:
a circuit board connected to the system connector;
a second exposed conductor on the second exposed side; and
a package connector between the second exposed conductor and the circuit board.

16. The system as claimed in claim 11 further comprising a device interconnect attached to the second inward side and the first inward side.

17. The system as claimed in claim 16 wherein the system connector includes the exposed leg and the exposed foot extended away from the first device.

18. The system as claimed in claim 16 wherein the system connector includes the exposed leg and the exposed foot extended away from the second device.

19. The system as claimed in claim 16 further comprising:
a second exposed conductor on the second exposed side; and
a through conductor in the second device connected to the second exposed conductor and the second inward side.

20. The system as claimed in claim 16 further comprising an underfill around the device interconnect between the first inward side and the second inward side.

\* \* \* \* \*